US006806721B2

(12) United States Patent
Kant (10) Patent No.: US 6,806,721 B2
(45) Date of Patent: Oct. 19, 2004

(54) DIGITAL ENVELOPE DETECTOR

(75) Inventor: Richard A. Kant, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/254,803

(22) Filed: Sep. 26, 2002

(65) Prior Publication Data

US 2003/0080751 A1 May 1, 2003

Related U.S. Application Data

(62) Division of application No. 09/602,659, filed on Jun. 28, 2000, now Pat. No. 6,462,559.

(51) Int. Cl.[7] .......................... G01R 27/02; G06F 19/00; G01D 1/18

(52) U.S. Cl. ................. 324/606; 324/76.13; 324/76.16; 702/193; 702/194

(58) Field of Search .......................... 324/76.13, 76.16, 324/76.19, 76.47, 76, 76.61, 606, 621, 76.49; 702/66, 70, 73, 193, 194

(56) References Cited

U.S. PATENT DOCUMENTS

| 4,584,711 A | * | 4/1986 | Dunn | 455/226.1 |
| 4,730,157 A | * | 3/1988 | Lepetit et al. | 324/76.22 |
| 4,785,232 A | * | 11/1988 | Ballato et al. | 324/727 |
| 5,166,620 A | * | 11/1992 | Panosh | 324/322 |
| 5,637,994 A | * | 6/1997 | Carder | 324/76.13 |

* cited by examiner

Primary Examiner—Anjan K. Deb
(74) Attorney, Agent, or Firm—John J. Karasek; John Gladstone Mills, III (57) ABSTRACT

A digital envelope detector (consisting of both hardware and software) that provides accurate measurements of changes of peak values of an AC signal (these peak values constitute the envelope of a signal). Such accurate envelope measurements are required to optimize the accuracy and selectivity of chemical sensors. A signal of interest is compared to each of a set of accurately calibrated reference voltages provided by a digital to analog converter. A digital logic circuit and software respond each time the signal fails to exceed the current reference voltage. In that event, relevant data (time or cycle count) are digitally recorded and a new reference voltage is installed. The process is repeated until the desired range of change of signal is measured.

1 Claim, 8 Drawing Sheets

DIGITAL ENVELOPE DETECTOR

CROSS REFERENCE TO RELATED APPLICATIONS

This application is a division of U.S. application Ser. No. 09/602,659 filed Jun. 28, 2000, now U.S. Pat. No. 6,462,559 issued Oct. 8, 2002.

BACKGROUND OF THE INVENTION

The present invention relates in general to the detection of the peak values of an AC signal and in specific to the detection and measurement of the response envelope of an AC signal as a function of time both rapidly and with high precision.

Prior methods of obtaining the envelope of an electrical signal rely upon: 1) the use of diode detector circuits incorporating an RC time constant; 2) digitizing the wave form of the signal and performing a mathematical fit to determine each peak value or 3) making measurement directly from an oscilloscope trace.

The first method which employs a diode detector circuit is limited in its accuracy because of the response characteristics of the RC circuit. Since the RC interaction includes a relatively substantial time delay, necessary for the charging and discharging of the capacitor the accuracy of the measurement is limited.

The second method, digitizing of the wave form, require substantial amounts of numerical manipulation of the data and requires a multitude of mathematical operations. This method also requires performing a mathematical "fit" which introduces error into the envelope measurement.

The third method is simply slow and inaccurate because it requires an operator to visually plot the decay response of the signal. All of the above techniques have limitations that are overcome by the new method.

The major improvement introduced by the new method is a large increase in the precision of measurements which results in correspondingly large increases in sensitivity of instruments employing the new technique.

SUMMARY OF THE INVENTION

It is an object of the present invention to provide a method for the efficient and accurate measurement of the envelope of an AC signal.

It is also an object of the present invention to provide a system which facilitates the accurate measurement of the peak amplitudes of an AC signal as a function of time and thus determine the envelope of the signal.

It is a further object to provide a means by which the decay response of an AC signal can be efficiently and accurately measured and recorded.

It is also an object to provide an accurate method for monitoring the rate of energy dissipation of a vibrating solid.

It is a further object to provide a device which provides the highest possible resolution in mechanical loss data in order to provide the highest sensitivity and selectivity from resonator based sensors.

These and other objects are accomplished with a digital envelope detector, consisting of both hardware and software, that provides accurate measurements of changes of peak values of an AC signal. These peak values constitute the envelope of a signal. Such accurate envelope measurements are required, e.g., to optimize the accuracy and selectivity of chemical sensors. The envelope values required for these sensors can not be obtained with common instruments (e.g. voltmeters) since these meters require that successive peaks be the same amplitude. Therefore, they can not measure the envelope of a gradually increasing or decreasing AC signal from the chemical sensors.

Prior to the instant invention, the only possible alternative was the use of high speed, high resolution analog-to-digital conversion (ADC) followed by extensive statistical analysis. The analog-to-digital conversion method is much more expensive, slower, and excessively complicated compared to the instant invention. Applicants' invention works as follows: A signal of interest is compared to each of a set of accurately calibrated reference (or threshold) voltages provided by a digital to analog converter. A digital logic circuit and software respond each time the signal fails to exceed the current reference voltage. If and when the monitored signal fails to exceed the reference voltage, relevant data (e.g. time or cycle count) are digitally recorded and a new reference voltage is installed. The process is repeated until the desired range of change of the signal is measured. The result is a set of amplitudes as a function of time and/or cycle that fully and accurately describe the desired portion of a signal envelope. The method for obtaining the highest resolution values for the envelope of an electrical signal are described by explaining its operation when it is applied to obtain the envelope of a monotonically decreasing signal, however this technique is not limited to this particular application.

DETAILED DESCRIPTION

The disclosed system enables the user to measure peak amplitudes of an electrical signal as a function of time both rapidly and with high precision. The system in its preferred embodiment comprises the disclosed envelope detector device, a CPU, and accompanying software which together are integrated into a system capable of making very accurate envelope measurements.

In brief, the basic concept this system employs is as follows. A multitude of reference points or threshold voltages are selected by the user or CPU. While the disclosed system is described by explaining its operation when it is applied to obtain the envelope of a monotonically decreasing signal, the technique is not limited to this particular application.

If the method is applied to obtain the envelope of a decaying sinusoidal signal the output is an array of numbers, cycles and peak amplitudes. The threshold voltages are selected from a range within the maximum amplitude of the oscillating sample. The sample may be a mechanical resonator or a resonance circuit. The sample's oscillation may be driven by an external source as needed and typically is controlled by the CPU. The CPU first selects the largest reference voltage, provides the reference voltage to the envelope detector circuit. The detector monitors each cycle counting the number of cycles and the time necessary for the input signal to "ring down" or fall below the level of the threshold. In a cycle where the input signal's amplitude fails to surpass the threshold level, the detector circuit generates a CPU interrupt and the CPU then executes an ultra fast subroutine which records the time and number of cycles the sample has performed, and selects the next highest threshold level. The CPU then re-initializes the detector circuit using the next threshold. When the samples oscillation amplitude falls below the amplitude of the second reference voltage, the same process is repeated, the time and cycle data is recorded, and the next higher reference point is selected. The process is repeated until the samples oscillation amplitude is less than the smallest of the selected reference points or all of the threshold reference points have been used. By using a carefully selected sequence of such thresholds, an array of count numbers and threshold values is obtained that can then be manipulated mathematically to obtain a best fit to any segment of the envelope function selected by the user. The processor then constructs the decay envelope of the sample on the basis of the recorded threshold, cycle and time data. Since an arbitrary envelope function can be completely described by a sequence of monotonically increasing and decreasing segments, the disclosed technique can be applied to a broad range of signals.

Figure 1:
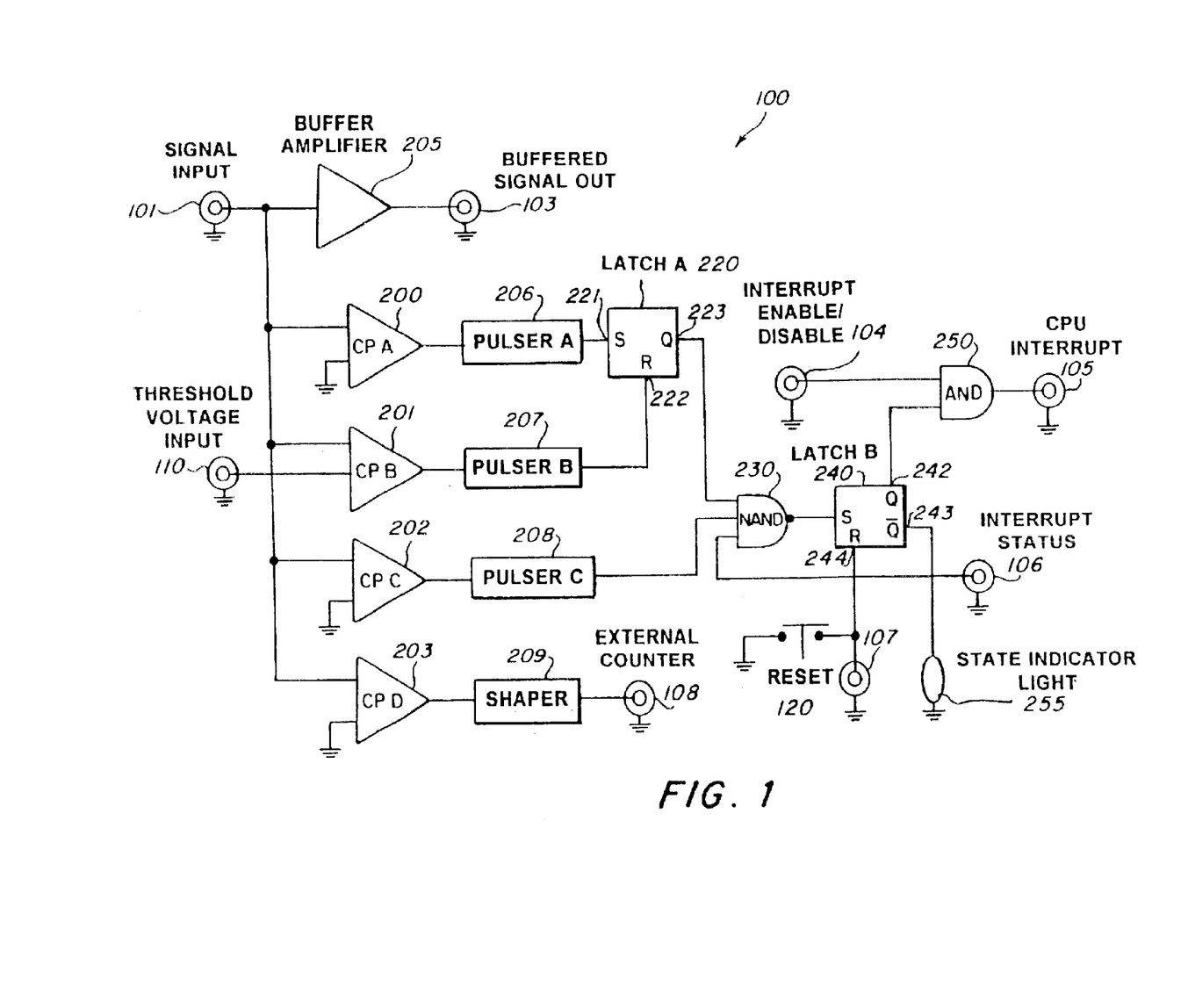
FIG. 1 is a block diagram of the envelope detector.

Referring now to the figures, wherein like numbers refer to like components, FIG. 1 shows a block diagram of the digital envelope detector 100. The reader should note that the system consist of both hardware and software which together, provide for the accurate measurement of the changes in peak values of an AC signal.

Detector 100, comprises four comparator circuits having at least two discrete inputs and one output. The comparator circuits are generic and may be constructed using differential amplifiers. One of the input terminals of comparator circuit A, 200, comparator circuit B, 201, comparator circuit C, 202, and comparator circuit D, 203 are coupled to the input signal which is generally an electrical expression of the oscillation of the sample or an input having an oscillation characteristic to be measured. Any signal having an oscillating characteristic is suitable. The second input terminal of comparator A, 200, comparator C, 202, and comparator D, 203 are coupled to ground. The second input of comparator circuit B, 201 is coupled to threshold voltage input, 110. The output signals of comparators A, B and C, 200, 201, 202 are each independently coupled to pulsers A, B, and C, 206, 207, and 208 or input into some type of Analog to Digital converter, capable of producing a high or low condition when the comparator is triggered. The output of comparator circuit D 203, is coupled to shaper 209 or similar signal conditioning component. Comparator circuit D 203 and shaper 209 provide both a filtered and shaped version of input signal 111, for use by external circuits such as counting devices.

Buffer amplifier 205 provides a buffered version of input signal 111 used by external circuits to monitor and to maintain input levels to the circuits that drive the resonator.

The output of pulser A 206 is coupled to set terminal 221 of latch circuit A 220. Latch A 220 features set, reset and output terminals 221, 222 and 223. The output of pulser B 207, is coupled to reset terminal of latch A 222. The output terminal of latch A 223 is coupled the first input of NAND gate 230, which has three input terminals. The second input of NAND gate 230 is coupled to the output of pulser C, 208. The output terminal of NAND gate 230 is coupled to a dual output latch circuit, 240. Latch B 240, has an output Q 242 and a output Q' 243. Output Q' 243 being the inverse of output Q 242. The Q' output of latch B 243, is coupled to the third input of NAND circuit 230 in a feedback configuration. The Q' output of latch B 243 is also coupled to light 255, or other visual state indicator, and an output 106, which indicates the interrupt status external to detector circuit 100. Reset terminal on latch B 244 is coupled to electronic external reset input 107 and manual reset switch 120. Latch B output Q 242, is coupled to one input terminal of AND gate 250. The second input terminal of AND gate 250 is coupled to an external enable/disable interrupt, 104. The output of AND gate 250 is coupled to CPU interrupt output, 105.

Figure 2A:
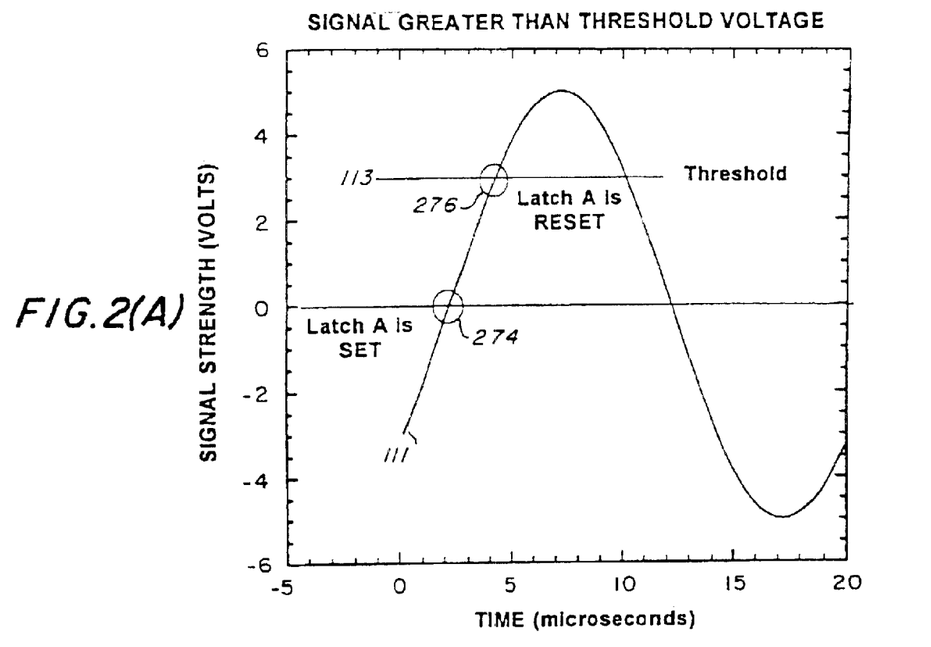
FIG. 2a is a chart showing the signal strength vs. time where the signal strength is greater than the threshold voltage.
Figure 2B:
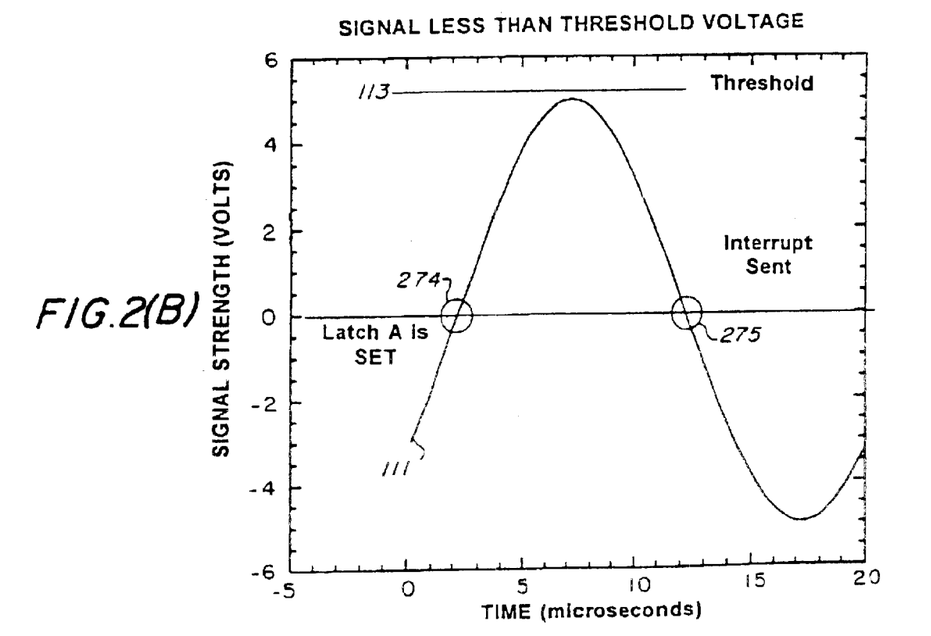
FIG. 2b is a chart showing the signal strength vs. time where the signal strength is less than the threshold voltage.
Figure 3:
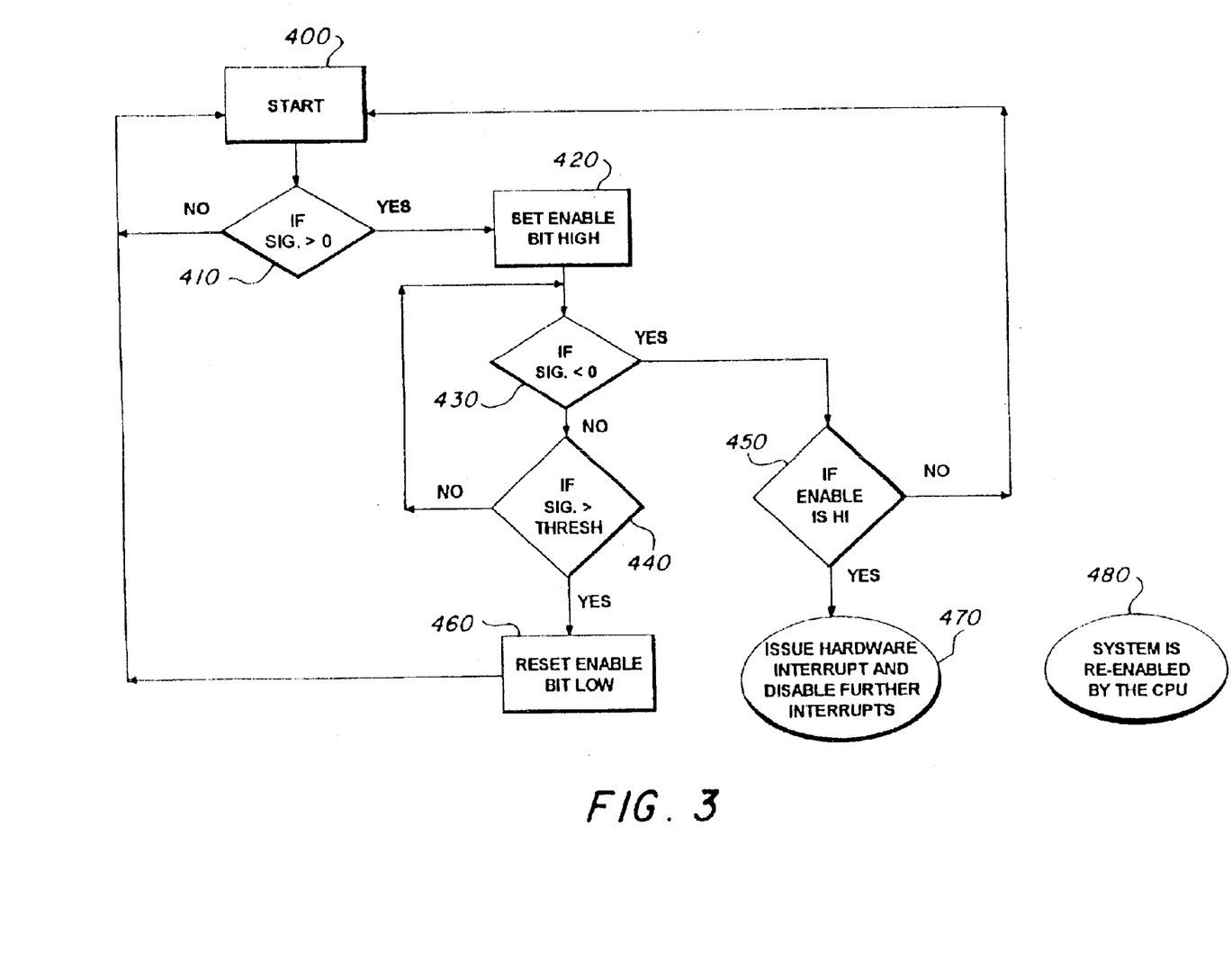
FIG. 3 is a flowchart of the envelope detectors hardware algorithm.

FIG. 3 shows a flow chart of the envelope detectors hardware loop. Referring now to FIGS. 1, 2 and 3 comparator A, 200 is triggered by the positive crossing zero crossing of the input signal during each cycle 274. When input signal 111 makes a zero crossing in the positive direction 275 comparator A, 200, is triggered and pulser 206, produce a low condition which results in the setting of latch A, 220 and produces a high condition at latch A output Q 223. FIG. 2(A) represents a cycle of input signal 111 in which the input signal level surpasses the selected threshold 113. Comparator B, 201 is responsive to the threshold voltage input 110 and the input signal 111. Referring again to FIG. 2(A) comparator B, 201 triggers Pulser 207, and produces a low condition, which resets Q 223 to a low state when input signal 111 exceeds the selected threshold 113 during a cycle. For each cycle in which threshold voltage 113 is exceeded by the input signals level, latch A, 220 produces a low condition at Q output 223. The output from latch A, 223, is used as one of the three drive inputs for NAND gate 230 which produces a high state as output for NAND gate 230. A high condition output by NAND gate 230 means the comparators will continue to monitor input signal 111.

Referring again to FIG. 1, comparator C, 202, triggers pulser 208 and produces a high state at each negative zero crossing of the input signal during a cycle. This high condition is then used as the second of the three drive inputs for NAND gate 230. The third input of NAND gate 230, which is coupled to the Q' output of latch B 243, has an initial condition of high, thus driving NAND gate 230 with another high signal. In a cycle in which the input signal amplitude is greater than the selected threshold voltage 113, as shown in FIG. 2(A), NAND gate 230 generates a high state at its output terminal. This high state drives latch B, 240, causing a low condition at latch B output Q 242. A low condition at latch b output Q 242 necessarily causes the CPU interrupt line to be in a low state or inactive, resulting in no CPU interrupt. Detector circuit 100 continues to monitor the "ringdown," and count the cycles until input signal's 111 amplitude falls below the selected threshold voltage. Referring again to FIG. 2(A) special note should be made as to the point in each cycle where latch A, 220 is set and reset.

FIG. 2(B) which shows a cycle in which the input signal's 111 magnitude fails to surpass the threshold level 113. Upon the happen of this event, envelope detector 100 sends an interrupt signal to CPU 800.

The positive zero crossing of input signal 111 results in a low condition at the set terminal of latch circuit A 221, however, since the conditions for a reset are not present, reset input of latch A, 222 remains in the high state. The absence of a reset condition in latch A, 220, produces a high condition at the output Q 223 which is used to drive the first input of NAND gate 230.

On the negative zero crossing of the input signal 275 a high condition is again transmitted to the second input of NAND gate 230, in addition to the high condition of the first input. The initial high condition of the Q' output of latch B 243, is coupled to the third input terminal of NAND gate 230, results in the third terminal of NAND gate 230 to be in a high state. The three high inputs into NAND gate 230, which result from the input signal amplitudes failure to surpass threshold 113, produce a low condition as output. This low output is coupled to latch B 240 and activates the set terminal of latch B 241 triggering a high condition output at Q 242. The high condition serves as an interrupt signal causing the CPU 800 to execute the ultra fast subroutine 600, which extracts the recorded cycle, time, threshold and frequency information and performs the signal processing functions.

A high state at latch B, output Q 242 necessarily means that Q' 243 is at a low state and a low is input into the input third terminal of NAND gate 230 producing a high output regardless of what is input into the first or second input terminal of NAND gate B 230. A low input into NAND gate 230 has the effect of isolating the rest of the detector circuit from latch B 240. Once a CPU interrupt has been issued, and ultra fast subroutine 600 has been executed CPU 800 issues a reset by causing a low state at the reset switch of latch B, 244 causing the Q output 242 to again reflect a low state. FIG. 1 also shows a manual reset switch 239 which effectively cause a low condition at reset terminal 244 when pushed.

FIG. 1 also shows AND gate 250, which has an input coupled to Q output of latch B 242 and to interrupt enable/disable input 104. AND gate 250 functions as a switch, a low condition input from the interrupt/enable disable input 104 having the effect of disconnecting CPU 800 from the detector 100 overriding any CPU interrupt signals transmitted from the envelope detector circuit 100.

FIG. 3 is a flowchart of the envelope detector's hardware loop. The logic of the detector's hardware is shown as thought it performs the indicated steps in sequence, but the zero crossing and threshold test are performed in parallel. The sequential structure is the result of the time dependence of a sinusoidal signal. Referring again to FIGS. 1, 2, and 3 the logic of decision box 410, which illustrates the test for a positive zero crossing 274, is performed by comparator A 200. Decision box 430 shows the negative zero crossing test 275 as performed by comparator C 202. Decision box 440 illustrates the threshold test performed by comparator B 201. Decision box 450 and output circles 470 and 480 describe the operation of NAND gate 230, and latch B 240. The operation of latch A, 220 is illustrated by function boxes 420 and 460.

Figure 4:
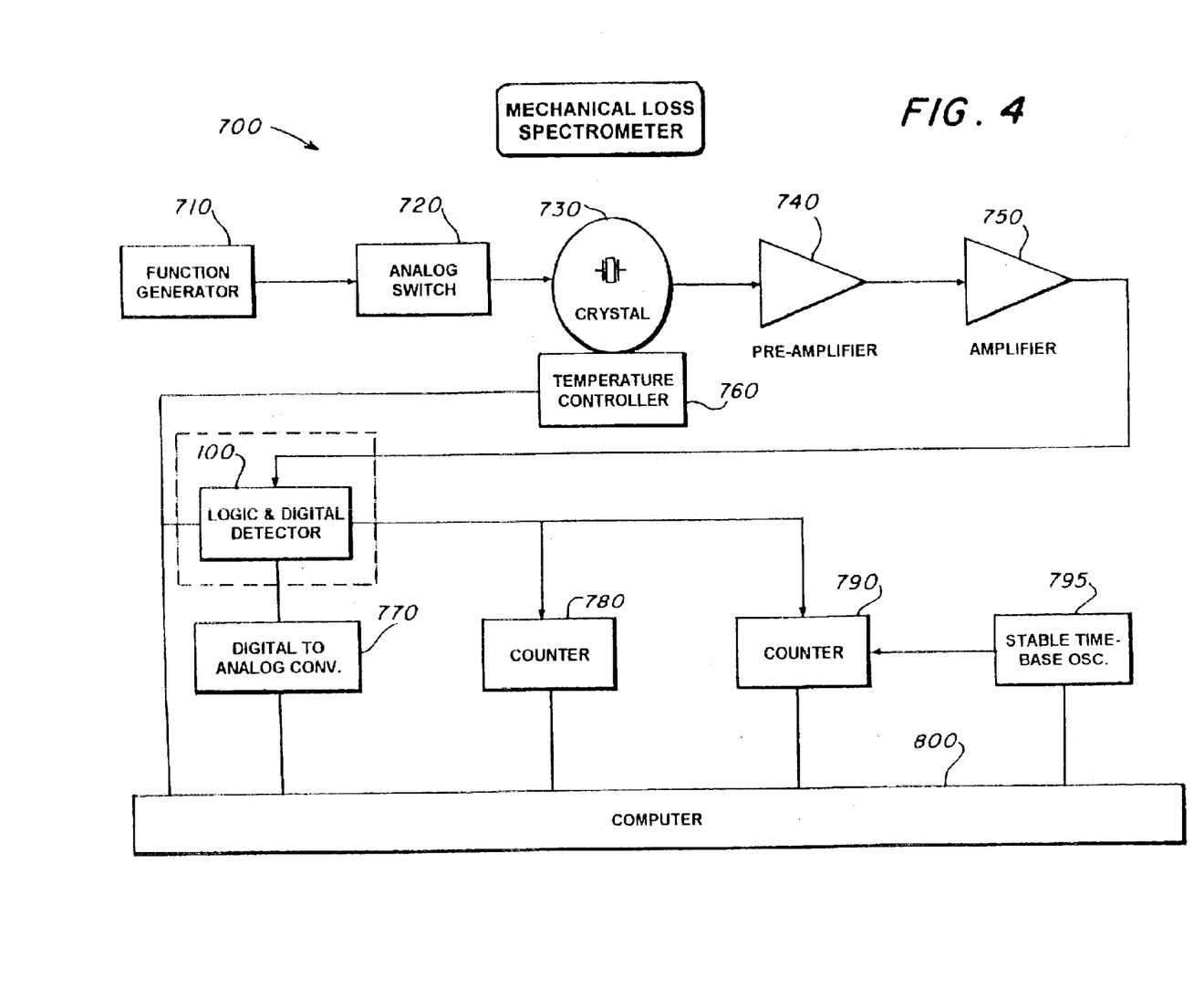
FIG. 4 is a block diagram of a mechanical loss spectrometer based on the envelope detector of FIG. 1.

Referring now to FIG. 4, which shows an embodiment of a mechanical loss spectrometer 700 employing the envelope detector, 100, a resonator 730, such as quartz, is driven by function generator 710 which acts as a source of excitation or ringer. The reader should note that although a quartz crystal resonator is used in this embodiment, any mechanical resonator is applicable. Analog switch 720, operates to decouple the source of excitation 710 from resonator 730 allowing resonator 730 to ringdown and dissipate energy. Temperature controller 760, interfaces with resonator 730 and allows the system to vary the temperature of the resonator. Function generator 710, analog switch 720, and temperature controller 730, are all coupled to and controlled by processor 800. Resonator 730 produces a signal 111 which is conditioned by preamplifier 740 and amplified by amplifier 750, at which point the signal is input into envelope detector 100 via the input signal input 101. Envelope detector 100 interfaces with counters 780 and 790 through external counter output 111 and with CPU 800 through CPU interrupt output, 105 reset input, 107 and interrupt enable/disable 104.

Digital to Analog converter, 770 is also coupled to the threshold voltage input 110 of envelope detector 100. Counters 780 and 790 interface with CPU 800. Stable time base oscillator 795 provides a reference for counter 790 and is also controlled by processor 800. In this embodiment the detector obtains the peak values as a function of the number of cycles executed by the signal. These peak values constitute the envelope of a signal. Such accurate envelope measurements are required, e.g., to optimize the accuracy and selectivity of chemical sensors. In addition to this data, the cycle count from an ultra stable time-base clock oscillator 795 is recorded for each zero crossing. Thus the envelope as a function of time is recorded.

Figure 5:
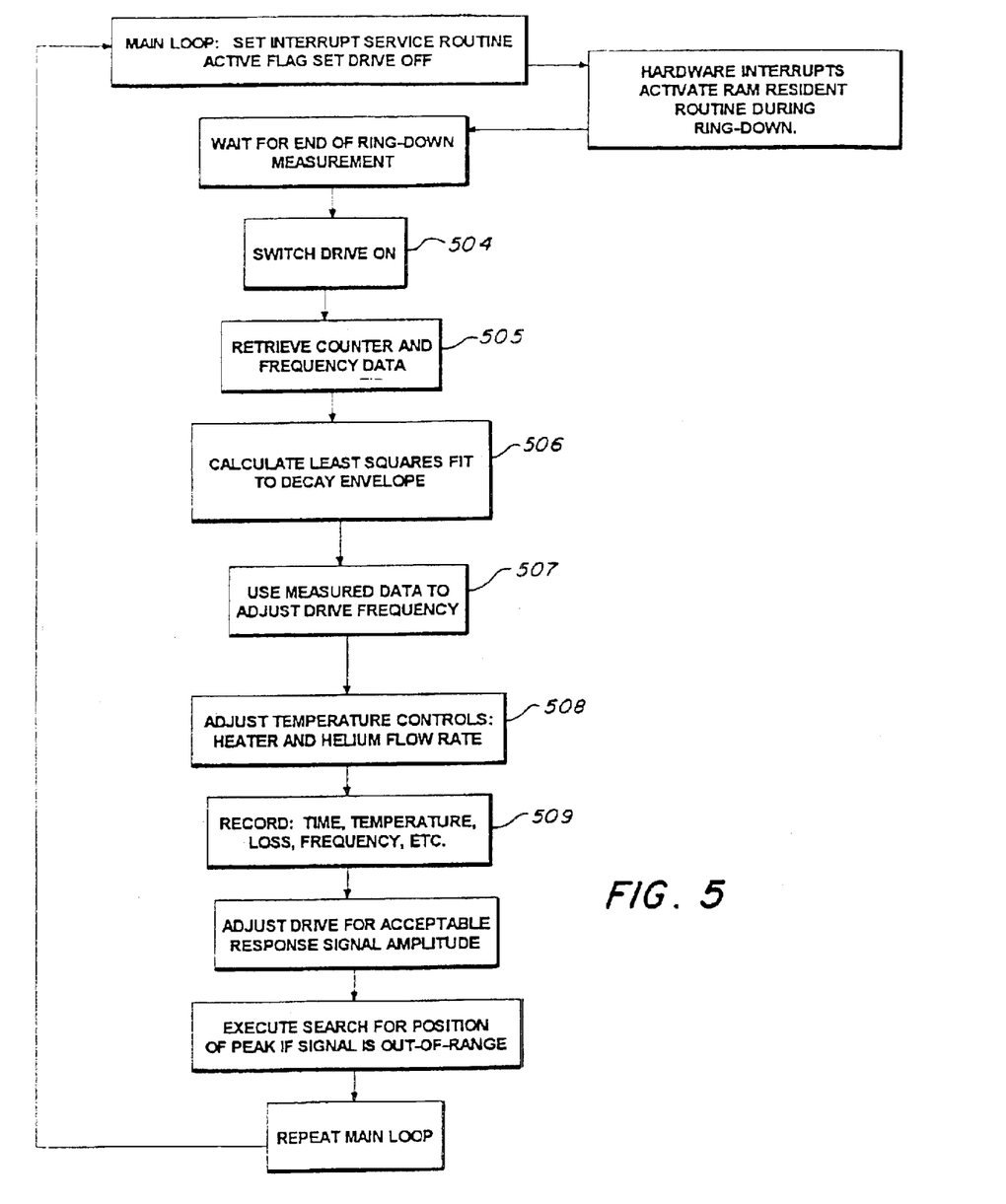
FIG. 5 is a table listing the subroutines needed to implement a loss spectrometer.

FIG. 5 flowchart illustrates the algorithm 500 used to implement loss spectrometer 700 using the envelope detector circuit, 100 of FIGS. 1 and 3. FIG. 5 also shows when the associated interrupt service routine 900 is active. Processor 800 enables the interrupt service routine by setting the active flag, and enabling the interrupt by driving AND gate, 250 with a high state. The drive 710 is then set to the off position 503, and envelope detector 100 proceeds with the ring down measurements. During the ringdown measurement hardware interrupts are generated by the envelope detector 100 when the input signal 111 fails to exceed the magnitude of the threshold voltage 113, activates the ultra fast subroutine 600 which is preferably in processor's 800 RAM.

When the ring down measurement is complete, (threshold voltages are exhausted by detector) the drive or source of excitation 710 is reactivated 504 and again couples to resonator 730. This prepares the detector for another series of measurements when the ultra fast subroutine 600 is complete. Processor 800 then retrieves the counter and frequency data 505 from counters 780, 790 and oscillator 795.

Processor 800 next calculates the decay envelope 506 for the instant ring down measurement by performing a least squares fit or other mathematical manipulation of the collected temperature, cycle, time and frequency data. Processor 800 may collect, generate and use data relating to additional parameters to increase accuracy. The processor then uses the measured data to adjusts the drive frequency 507 to set the resonators oscillation for peak response and adjusts the temperature 508 via temperature controller 760.

Processor 800, next records the time, temperature, loss, frequency and other data 509. Processor 800 then adjusts the drive for desired response signal amplitude executing a search for the position of the resonator's peak signal if the input signal is out-of-range. The algorithm illustrated in FIG. 5 is repeated for each series of ringdown measurements.

Figure 6:
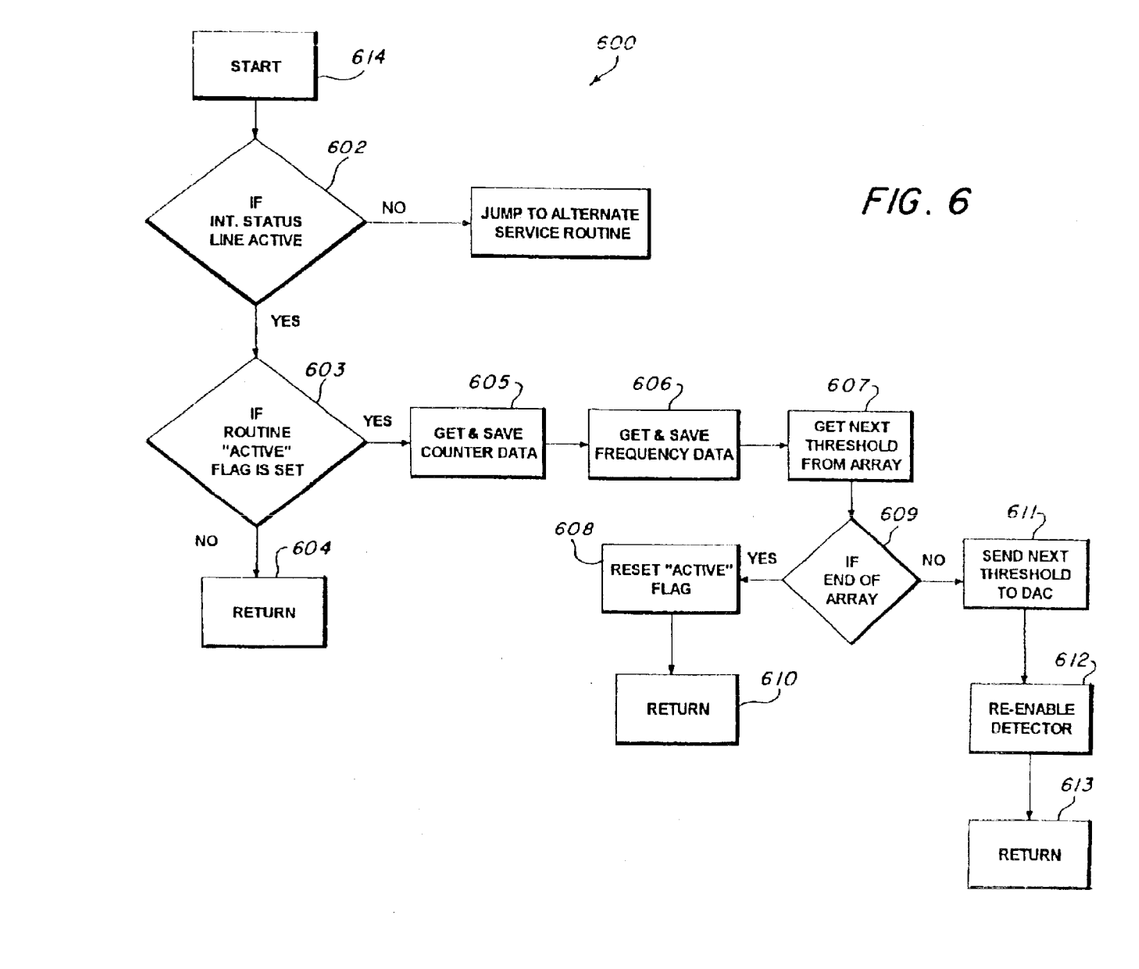
FIG. 6 is a flowchart of the ultra fast service algorithm initiated by an interrupt from the detector hardware.

FIG. 6 is an algorithm for the ultra fast service routine 600 initiated by an interrupt from the envelope detector 100. This algorithm activates 614 each time input signal 111 fails to surpass the threshold voltage as illustrated in FIG. 2(B). Referring again to FIG. 6 and FIG. 4, when the interrupt status line is active and the active flag set as shown in decision boxes 602 and 603, respectively, processor 800 proceeds to retrieve and save the counter data from counter 780 and the frequency data from counter 790 and oscillator 795. Processor 800 then retrieves the next threshold from a storage array as shown is process box 607. The threshold is processed by the digital to analog converter, 611 prior to being sent to the envelope detector's threshold voltage input 101.

The new threshold is loaded into the detector, and processor 800, then re-enables the detector 612 with a reset command input into reset input 107. The reset command resets latch B, 240 causing Q' 243 to flip to a high state. Envelope detector 100 then continues the ringdown measurement 613 using the new threshold until the next processor interrupt is sent. When the processors storage array is empty (threshold voltages exhausted) processor 800 will reset the active flag 608 and return to the subroutine loop 500 as shown in step 610.

Figure 7:
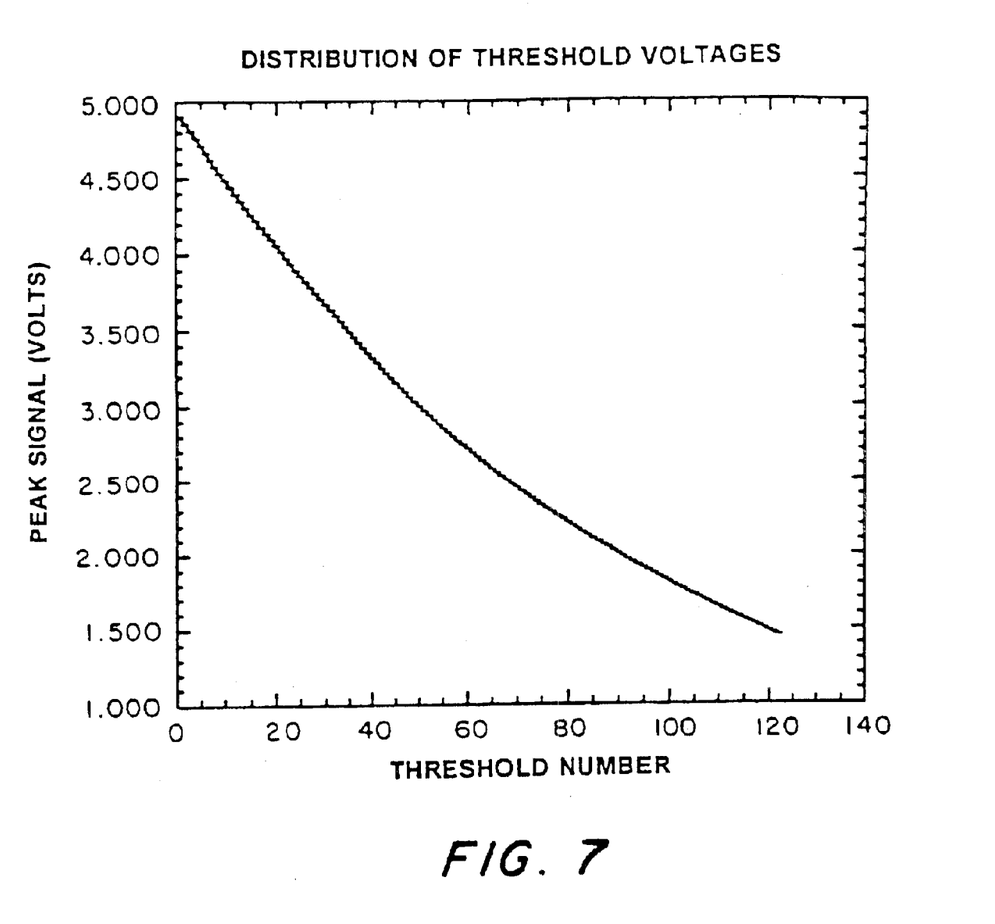
FIG. 7 is a graph of the distribution of threshold voltages as a function of peak signal.

FIG. 7 shows a distribution of threshold voltages used to determine the decay envelope of an AC signal generated from a vibrating crystal. This measurement used approximately 128 threshold voltages and shows the exponential nature of the decay curve. The reader should note that as the peak signal becomes smaller in amplitude the threshold voltages become closer together and reflect a smaller range in distribution.

Figure 8:
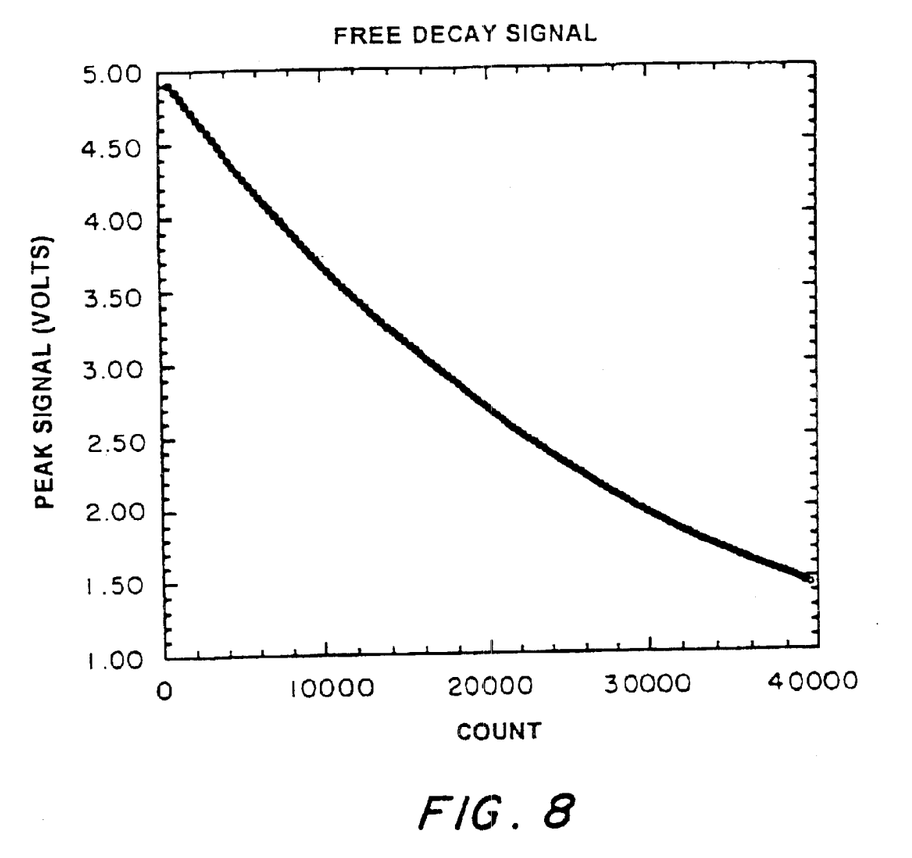
FIG. 8 is a graph of the free decay signal of a vibrating crystal measured by the mechanical loss spectrometer employing the envelope detector.

FIG. 8 shows a graph of a free decay signal with a frequency of approximately 50 kHz. The resonator used had a quality factor of approximately $100.6 \times 10^3$. The envelope detector provides a resolution variation of 5 significant digits allowing very accurate envelope measurements of mechanical loss, energy dissipation of vibrating solids. This high resolution characteristic of the envelope detector allows the construction of chemical sensors and other instruments which display a very high sensitivity and low false alarm rate.

As in any application it is essential that electrical hardware be selected such that the speed of the devices employed is adequate for the frequency of the carrier and the time rate of change of the envelope.

While the salient features of the invention have been illustrated and described, it should be readily apparent to those skilled in the art that many changes and modifications can be made in the system of the invention present without departing from the spirit and scope of the invention. For example the detector of FIG. 1 could be implemented with different logic circuits and timing signals, operated with serial data instead of parallel data or vice-versa and/or modified as previously described to use a different resonator. It is therefore intended to cover all such changes and modification in the invention that fall within the spirit and scope of the invention as set forth in the claims.

What is claimed is:

1. A process for digitally detecting a decay envelope of an AC signal in a mechanical loss spectrometer, comprised of:

selecting a first or highest reference voltage;

setting interrupt service routine active flat set drive OFF interrupting RAM resident routine during ringdown;

waiting for the end of ringdown measurement;

switching drive OFF;

retrieving counter and frequency data;

calculating least squares fit to decay envelope;

adjusting drive frequency using measured data;

adjusting temperature controls;

recording time, loss, frequency, and temperature data;

adjusting drive for acceptable response signal amplitude;

executing search for position of peak if signal is set out of range; and repeating main loop for next or second highest reference voltage.

* * * * *